United States Patent
Shiraishi

(10) Patent No.: US 8,805,131 B2
(45) Date of Patent: Aug. 12, 2014

(54) OPTICAL MODULE AND FABRICATION METHOD

(75) Inventor: Takashi Shiraishi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 603 days.

(21) Appl. No.: 13/064,784

(22) Filed: Apr. 14, 2011

(65) Prior Publication Data

US 2012/0002915 A1    Jan. 5, 2012

(30) Foreign Application Priority Data

Jul. 5, 2010 (JP) .................................. 2010-153324

(51) Int. Cl.
G02B 6/26 (2006.01)

(52) U.S. Cl.
USPC ................ 385/14; 385/31; 385/39; 385/88

(58) Field of Classification Search
None
See application file for complete search history.

(56) References Cited

U.S. PATENT DOCUMENTS

| | | | | |
|---|---|---|---|---|
| 6,396,116 B1* | 5/2002 | Kelly et al. | .................... | 257/432 |
| 6,516,104 B1* | 2/2003 | Furuyama | ....................... | 385/14 |
| 6,706,546 B2* | 3/2004 | Yoshimura et al. | ............. | 438/31 |
| 6,792,179 B2* | 9/2004 | Lu et al. | .......................... | 385/33 |
| 7,239,767 B2* | 7/2007 | Kim et al. | ....................... | 385/14 |
| 7,263,248 B2* | 8/2007 | Windover | ........................ | 385/14 |
| 2002/0051599 A1* | 5/2002 | Tsukamoto et al. | ............. | 385/14 |
| 2002/0196997 A1* | 12/2002 | Chakravorty et al. | .......... | 385/14 |
| 2004/0160676 A1 | 8/2004 | Kaneko et al. | | |
| 2006/0263003 A1* | 11/2006 | Asai et al. | ........................ | 385/14 |
| 2007/0085215 A1* | 4/2007 | Budd et al. | ..................... | 257/778 |
| 2009/0020839 A1 | 1/2009 | Furuyama | | |
| 2011/0108716 A1* | 5/2011 | Shiraishi | .................. | 250/227.24 |
| 2012/0076454 A1* | 3/2012 | Shiraishi | ......................... | 385/14 |
| 2012/0189253 A1* | 7/2012 | Shacklette et al. | .............. | 385/88 |

FOREIGN PATENT DOCUMENTS

| | | |
|---|---|---|
| JP | 2000-66064 | 3/2000 |
| JP | 2004-241630 | 8/2004 |
| JP | 2006-047764 | 2/2006 |
| JP | 2008-107781 | 5/2008 |
| JP | 2008-158388 | 7/2008 |
| JP | 2009-016707 | 1/2009 |

OTHER PUBLICATIONS

Japanese Office Action mailed Dec. 3, 2013 in corresponding Japanese Application No. 2010-153324.

* cited by examiner

*Primary Examiner* — Mike Stahl
(74) *Attorney, Agent, or Firm* — Staas & Halsey LLP

(57) ABSTRACT

An optical module includes an optical waveguide that transmits and outputs signal light; a circuit board that transmits the signal light output from the optical waveguide, and includes a low refractive-index portion that neighbors and surrounds a transmissive portion and has a lower refractive index than the transmissive portion, which transmits the signal light; and a light-receiving element that includes, on a side toward the circuit board, a light-receiving portion that receives the signal light that has transmitted through the circuit board, where the signal light is reflected toward the light-receiving element at a boundary surface between the transmissive portion and the low refractive-index portion.

11 Claims, 18 Drawing Sheets

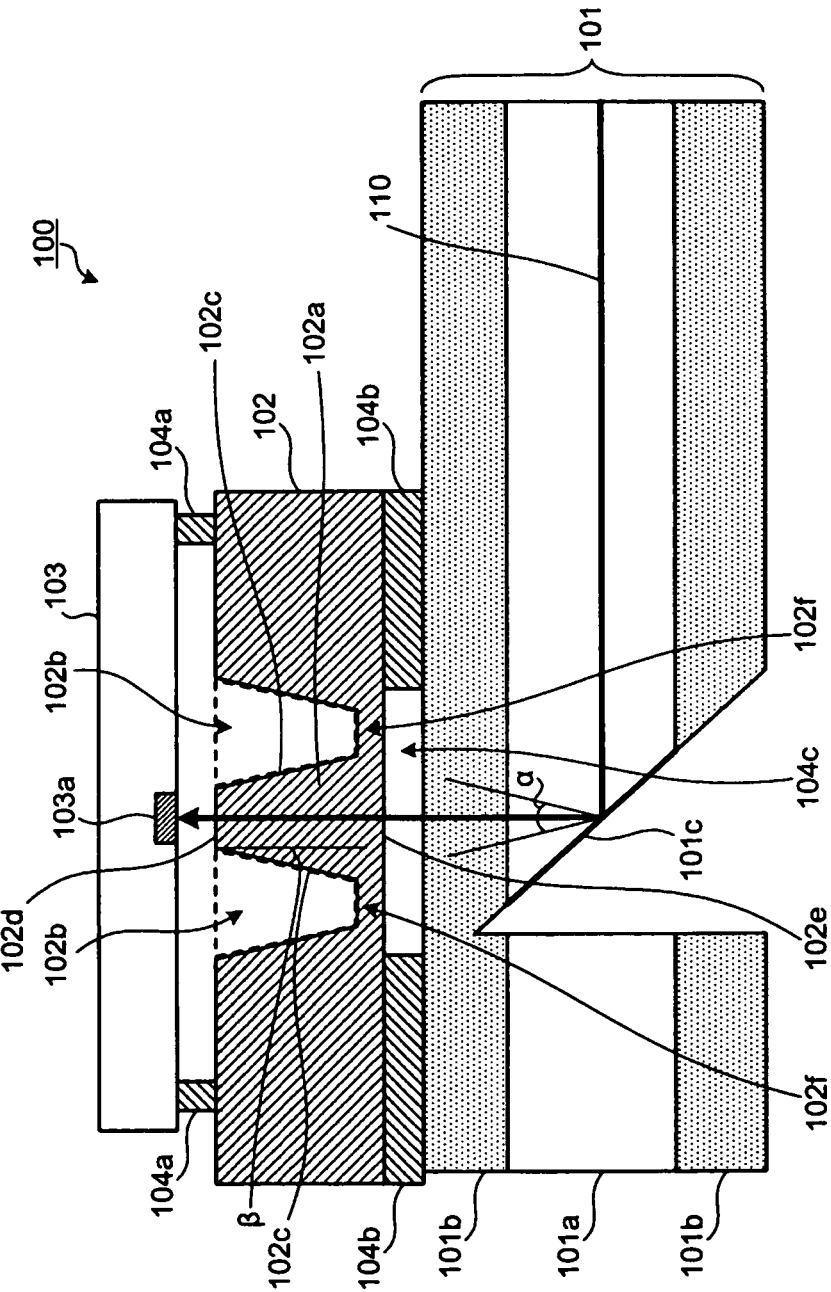

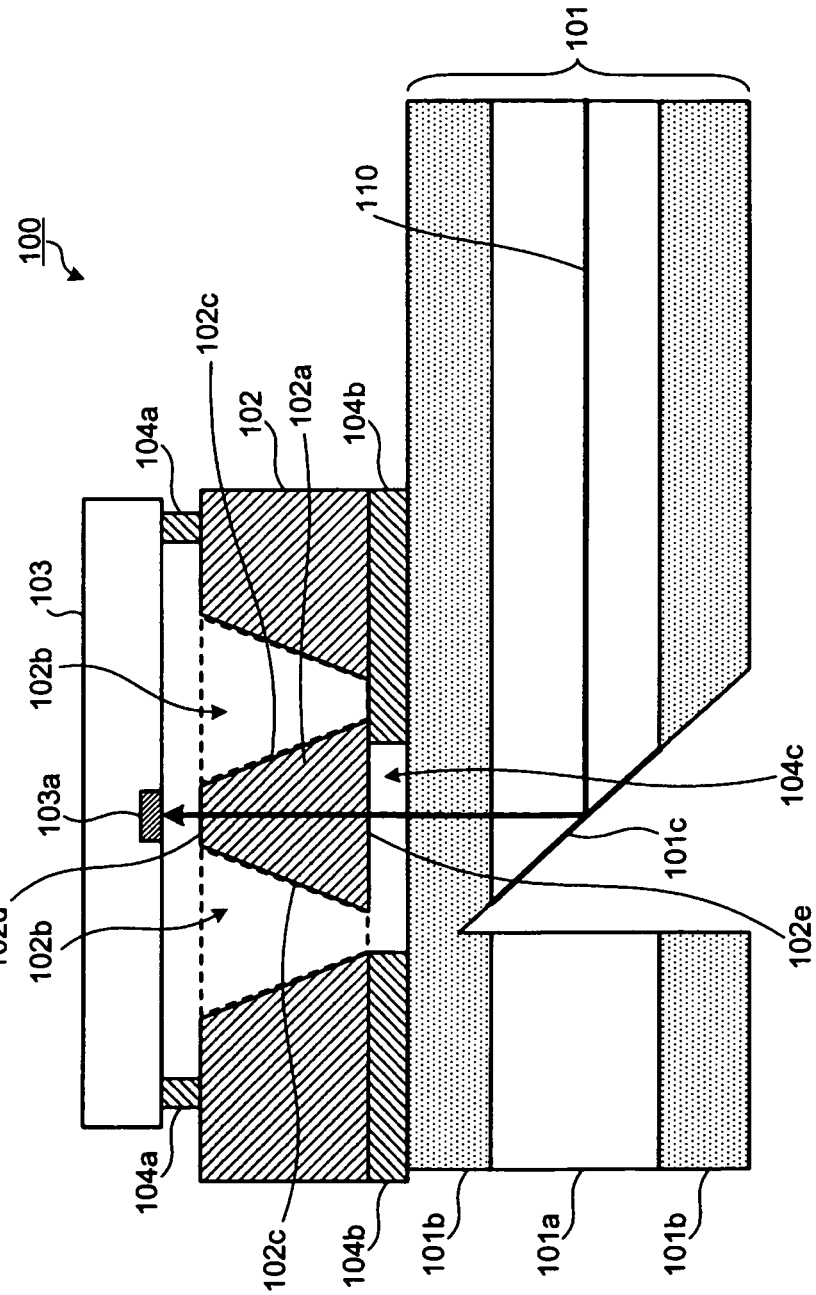

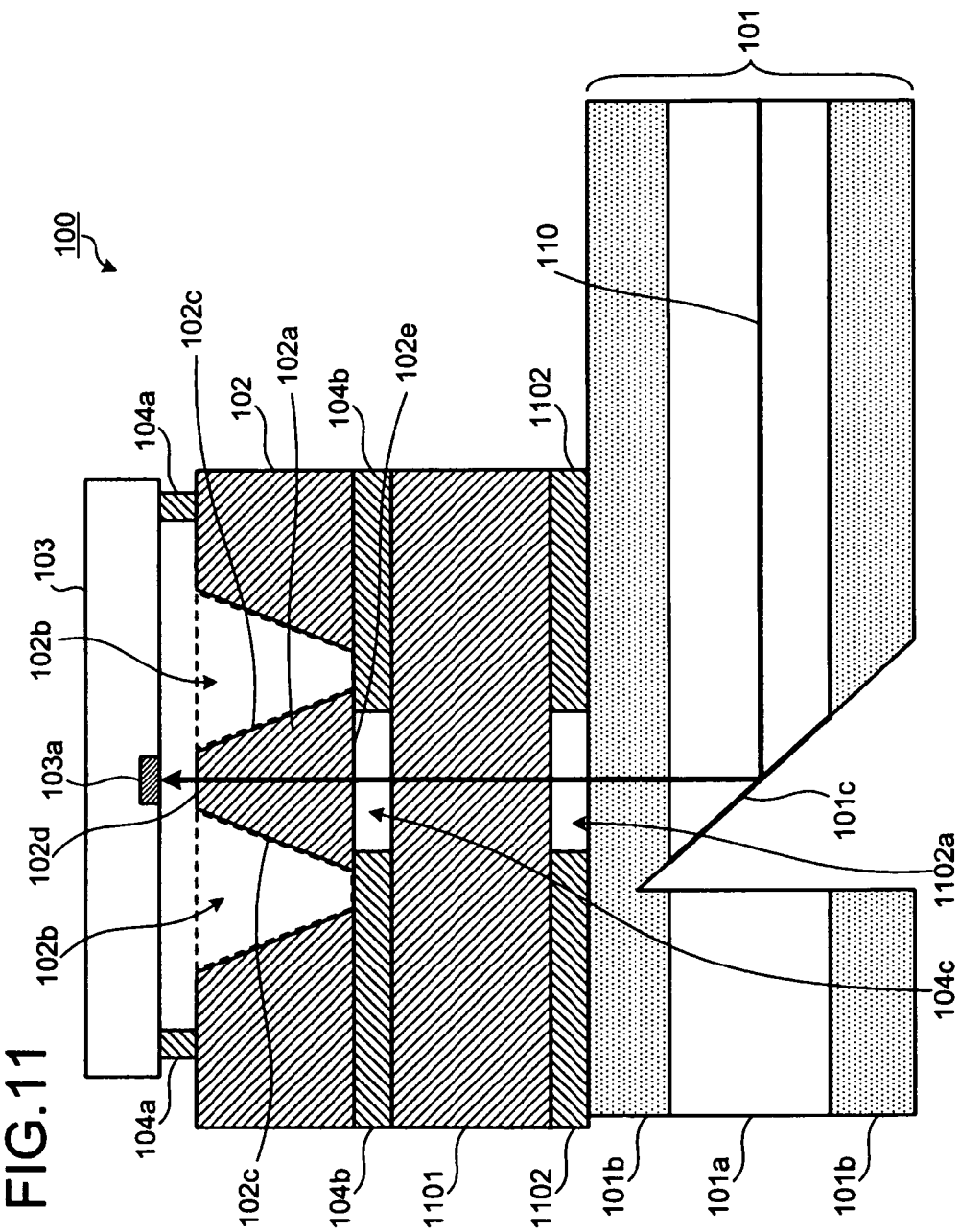

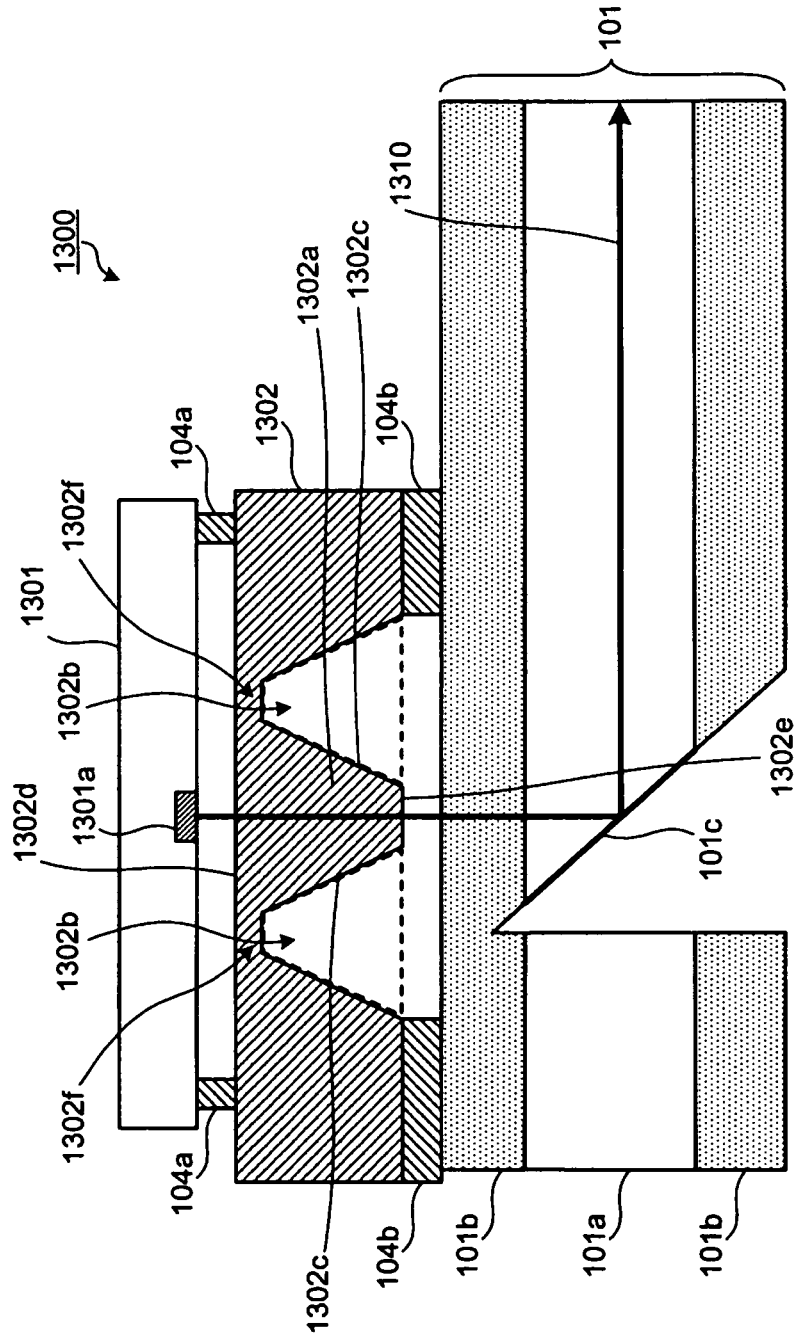

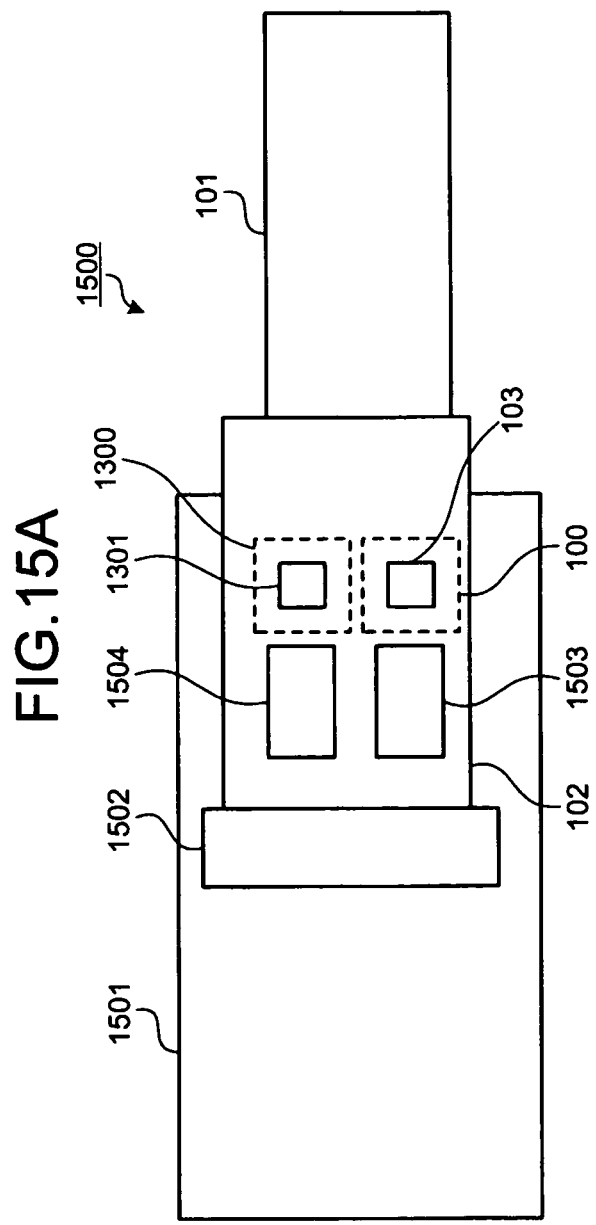

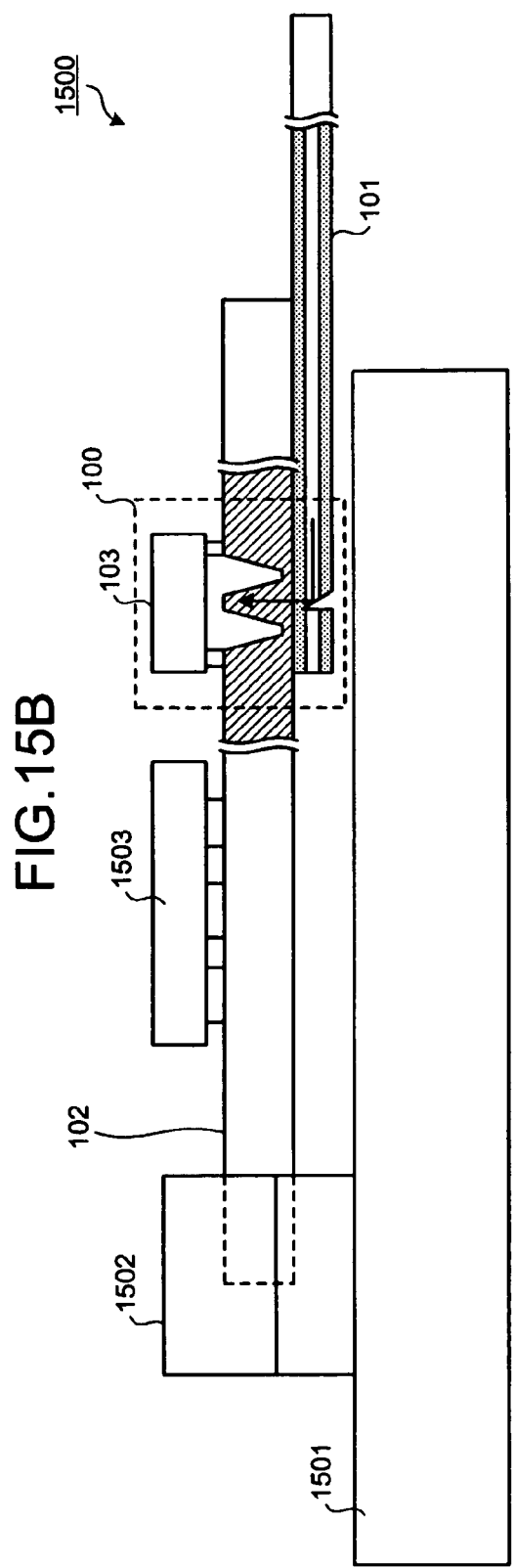

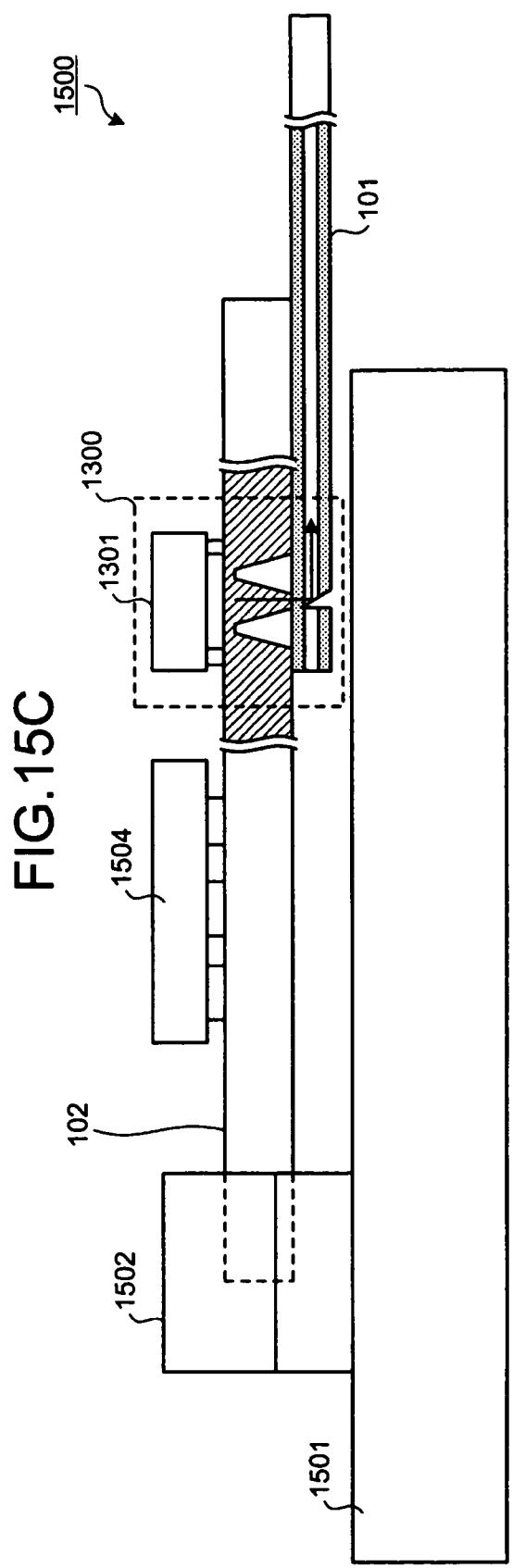

OPTICAL MODULE AND FABRICATION METHOD

CROSS REFERENCE TO RELATED APPLICATIONS

This application is based upon and claims the benefit of priority of the prior Japanese Patent Application No. 2010-153324, filed on Jul. 5, 2010, the entire contents of which are incorporated herein by reference.

FIELD

The embodiments discussed herein are related to an optical module and a fabrication method.

BACKGROUND

Recently, in the field of servers and high-end computers, transmission capacity of input/output (I/O) function for communication between a CPU and an external interface has increased due to an improvement of performance. Meanwhile, in conventional high-speed electrical transmission, optical interconnect technology has been considered that enables high-capacity transmission by optoelectronic devices and optical signals.

Optical interconnect technology requires a smaller and lower-cost optical module than that for conventional backbone optical communication. Such an optical module is known that includes a circuit board that has a transparent material, an optical element (e.g., a light-emitting element and a light-receiving element) mounted on one surface, and an optical waveguide arranged on the opposite surface.

To further reduce fabrication cost of the optical module, a conventional transparent FPC board, on which an optical transmission element is mounted, is made of a thin film of, for example, polyimide, whereby low-cost and high-speed optical communication is enabled by providing such an optical module on, for example, a printed board in a server via an electrical connector.

In the field of the optical interconnect technology, a growing demand for fast optical transmission exceeding 20 Gbps requires utilization of an optical module on which a fast light-emitting/receiving element is mounted. However, coupling loss of signal light between the light-emitting/receiving element and the optical waveguide is large in the optical module described above.

For example, the larger the difference between the aperture of the light-emitting/receiving portion of the optical element and that of the inlet/outlet of the optical waveguide is (the apertures are not necessarily the same), the larger the coupling loss becomes due to leakage of the signal light. In particular, the higher the performance is, the smaller the aperture of the light-receiving portion of the light-receiving element becomes. For example, the aperture of a light-receiving portion of a light-receiving element that achieves optical communication exceeding 20 Gbps is about 30 µm. Thus, the coupling loss becomes large if a common multimode waveguide is used, since the aperture of the outlet is about 50 µm.

The greater the distance between the optical element and the optical waveguide is, the larger the coupling loss becomes since the signal light output from the optical waveguide and that output from the light-emitting portion of the light-emitting element are dispersed. To cope with this, a technology for suppressing the dispersion of the signal light by providing a collecting member of the signal light on the circuit board is disclosed in, for example, Japanese Laid-Open Patent Publication Nos. 2004-241630, 2009-16707, and 2006-47764.

However, in the conventional technology described above, the optical module cannot be easily fabricated due to the complicated fabrication process of the member that suppresses the dispersion of the signal light.

SUMMARY

According to an aspect of an embodiment, an optical module includes an optical waveguide that transmits and outputs signal light; a circuit board that transmits the signal light output from the optical waveguide, and includes a low refractive-index portion that neighbors and surrounds a transmissive portion and has a lower refractive index than the transmissive portion, which transmits the signal light; and a light-receiving element that includes, on a side toward the circuit board, a light-receiving portion that receives the signal light that has transmitted through the circuit board, where the signal light is reflected toward the light-receiving element at a boundary surface between the transmissive portion and the low refractive-index portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1A and 1B are a cross-sectional view and an enlarged cross-sectional view of a light-receiving module according to a first embodiment, respectively.

FIG. 9 is a cross-sectional view of a light-receiving module according to a modification of the second embodiment.

FIG. 11 is a cross-sectional view of a light-receiving module according to a third embodiment.

FIG. 13 is a cross-sectional view of a light-emitting module according to a fourth embodiment.

FIG. 15A is a top view of an optical transmission device on which the light-receiving module depicted in FIG. 1A and the light-emitting module depicted in FIG. 13 are mounted.

FIGS. 15B and 15C are partial cross-sectional views of the optical transmission device including the light-receiving module and the light-emitting module, respectively.

DESCRIPTION OF EMBODIMENTS

Figure 1B:
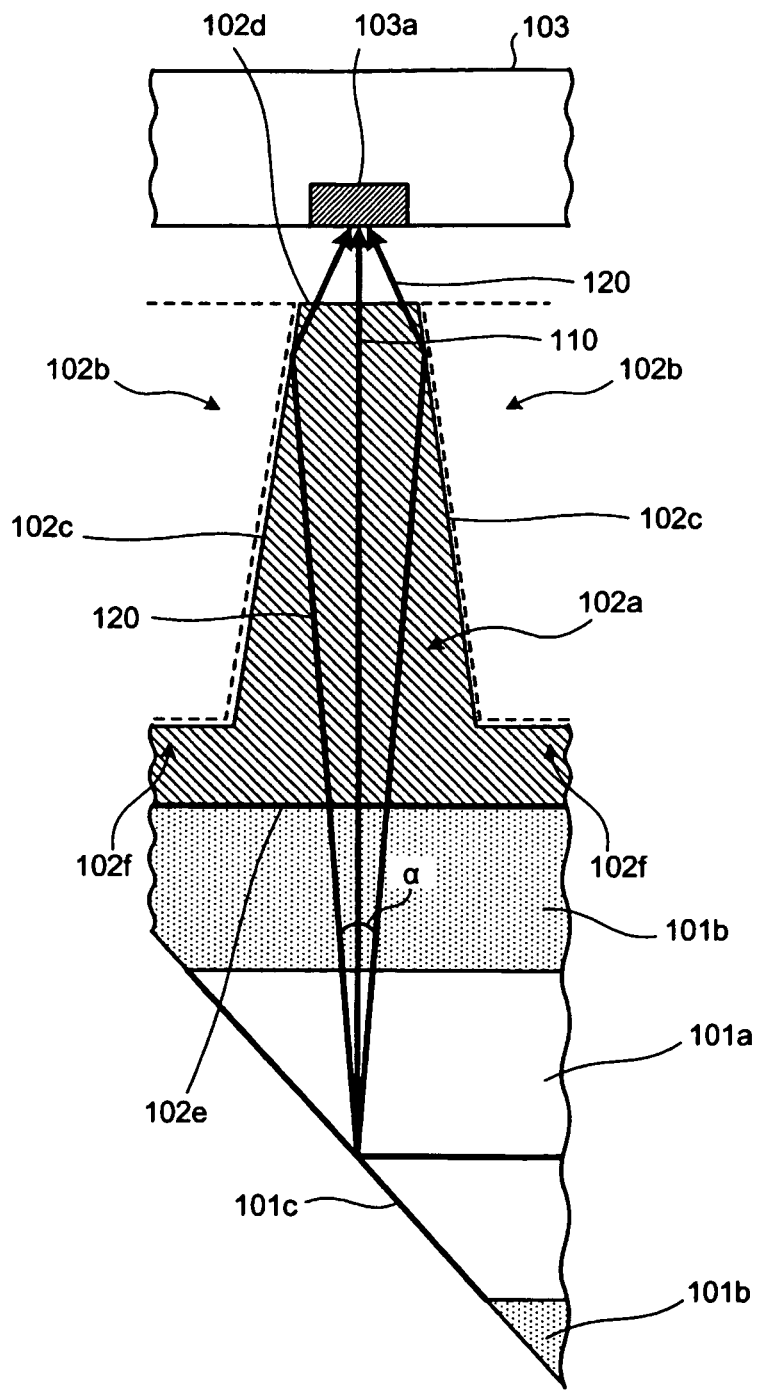

Preferred embodiments of the present invention will be explained with reference to the accompanying drawings.

FIG. 1A is a cross-sectional view of a light-receiving module according to a first embodiment. A light-receiving module 100 is an optical module that includes an optical waveguide 101, a transparent circuit board 102, and a light-receiving element 103.

The optical waveguide 101 transmits and outputs signal light to the circuit board 102. The optical waveguide 101 includes a core 101a at the center and cladding 101b that has a lower refractive index than the core 101a and is arranged around the core 101a. Thus, the signal light transmits through the core 101a while being completely reflected by the boundary surface between the core 101a and the cladding 101b.

For example, a polymer waveguide composed of epoxy resin and/or acrylate resin may be used as the optical waveguide 101. Herein, it is assumed that a common polymer waveguide is used as the optical waveguide 101; the thickness of the optical waveguide 101 is 100 µm; and the thickness of the core 101a is 50 µm. In the optical waveguide 101, a mirror 101c is provided that is configured to reflect toward the circuit board 102, the signal light transmitted in the optical waveguide 101. The inclination of the mirror 101c is 45°, for example.

The circuit board 102 is positioned such that the signal light output from the optical waveguide 101 is transmitted therethrough. For example, the circuit board 102 is a flexible printed circuit (FPC) board that includes a polyimide thin film, where the thickness of the circuit board 102 is 50 µm, which is the thickness of a common FPC board.

On the circuit board 102, at a surface on the light-receiving element 103 side of the circuit board 102, signal electrodes 104a connected to the light-receiving element 103 are provided as a circuit pattern. At a circuit board 102 surface on the side opposite to the light-receiving element 103 side of the circuit board 102, a ground electrode 104b that transmits the signal light is provided.

The circuit board 102 includes a transmissive portion 102a that transmits the signal light and a low refractive-index portion 102b having a lower refractive index than the transmissive portion 102a. The low refractive-index portion 102b is made of an air layer or a given material with low refractive index. The transmissive portion 102a and the low refractive-index portion 102b are formed such that a complete reflection condition is satisfied and the signal light output from the optical waveguide 101 is completely reflected at a boundary surface 102c between the transmissive portion 102a and the low refractive-index portion 102b.

In the light-receiving element 103, on the circuit board 102 side of the light-receiving element 103, a light-receiving portion 103a is provided that receives the signal light transmitted through the circuit board 102. For example, the light-receiving portion 103a is a photo diode (PD) and converts the received signal light to a signal current transmitted through the signal electrodes 104a connected to the light-receiving element 103. For example, the light-receiving portion 103a has an aperture of about 30 µm and has a circular light-receiving surface.

As described above, the light-receiving module 100 is configured such that the signal light transmitted through and output from the optical waveguide 101 is completely reflected at the boundary surface 102c and output from the transmissive portion 102a to the light-receiving element 103, as indicated by an optical path (optical axis) 110 in the figure. Thus, the dispersion of the signal light output from the optical waveguide 101 during transmission through the circuit board 102 can be suppressed.

The transmissive portion 102a is formed as a truncated cone having a top surface 102d toward the light-receiving element 103 and a bottom surface 102e toward the optical waveguide 101. The area of the top surface 102d is smaller than that of the bottom surface 102e. Since the transmissive portion 102a is formed such that its cross section perpendicular to the traveling direction of the signal light becomes smaller toward the top surface 102d, the signal light input to the bottom surface 102e of the transmissive portion 102a is collected and output from the top surface 102d.

Thus, the signal light can be collected corresponding to the area of the light-receiving portion 103a of the light-receiving element 103 even when the area is smaller than the area of the signal light output from the optical waveguide 101, thereby improving the coupling efficiency.

The transmissive portion 102a is not limited to the truncated cone as long as it is formed such that the complete reflection condition is satisfied and the area of the cross section perpendicular to the traveling direction of the signal light becomes smaller toward the light-receiving element 103. For example, the transmissive portion 102a may be shaped such that the area of the cross section becomes smaller toward the top surface 102d at a constant rate (e.g., N-sided pyramid) or an inconstant rate.

The circular top surface 102d of the transmissive portion 102a can collect the signal light output from the optical waveguide 101 into a circular shape, thereby enabling low-loss coupling of the signal light to the circular light-receiving portion 103a. The shape of the transmissive portion 102a that collects the signal light into a circular shape is not limited to the cone described in the first embodiment.

For example, a cylindrical transmissive portion 102a can collect the signal light into a circular shape, thereby enabling low-loss coupling of the signal light to the circular light-receiving portion 103a. The light-receiving surface of the light-receiving portion 103a and the top surface 102d of the transmissive portion 102a that are formed as identical polygons also enable low-loss coupling of the signal light.

As described above, the transmissive portion 102a and the low refractive-index portion 102b are formed such that the complete reflection condition is satisfied and the signal light output from the optical waveguide 101 is completely reflected at the boundary surface 102c between the transmissive portion 102a and the low refractive-index portion 102b. An example of the complete reflection condition is described next.

The complete reflection condition means that the maximum incident angle of the signal light output from the optical waveguide 101 to the boundary surface 102c is larger than the critical angle at the boundary surface 102c between the transmissive portion 102a and the low refractive-index portion 102b. The critical angle $\theta c$ at the boundary surface 102c between the transmissive portion 102a and the low refractive-index portion 102b is represented by $\theta c = \arcsin(n2/n1)$, where n1 is the refractive index of the transmissive portion 102a and n2 is the refractive index of the low refractive-index portion 102b.

The maximum incident angle θmax is represented by θmax=90−β−α/2, where α(°) is the spread angle of the signal light output from the optical waveguide 101 and β(°) is the slope of the truncated cone of the transmissive portion 102a.

An example that satisfies the complete reflection condition is: the thickness of the core 101a is 50 µm; the spread angle α is 21°; n1=1.7; n2=1.0; and θc=36°. To satisfy this, the thickness of the circuit board 102 is set to 50 µm, the diameter of the top surface 102d of the transmissive portion 102a is set to 20-50 µm, and the diameter of the bottom surface 102e of the transmissive portion 102a is set to 50-100 µm, for example.

The transmissive portion 102a is formed such that the bottom is contiguous to the circuit board 102 via a supporting portion 102f. No fixing member that fixes the transmissive portion 102a is required since the supporting portion 102f is a part of the circuit board 102.

FIG. 1B is an enlarged cross-sectional view of the light-receiving module according to the first embodiment. The signal light output from the optical waveguide 101 is transmitted through the transmissive portion 102a of the light-receiving module 100.

The signal light is refracted by the mirror 101c on the optical path 110 and dispersed with the spread angle α. The dispersed signal light traveling the optical path 120 is input to the transmissive portion 102a from the bottom surface 102e, completely reflected at the boundary surface 102c toward the light-receiving portion 103a, and output from the top surface 102d, thereby suppressing dispersion. The sloped boundary surface 102c enables more efficient suppression of dispersion and collection of the signal light to the light-receiving portion 103a.

Figure 2A:
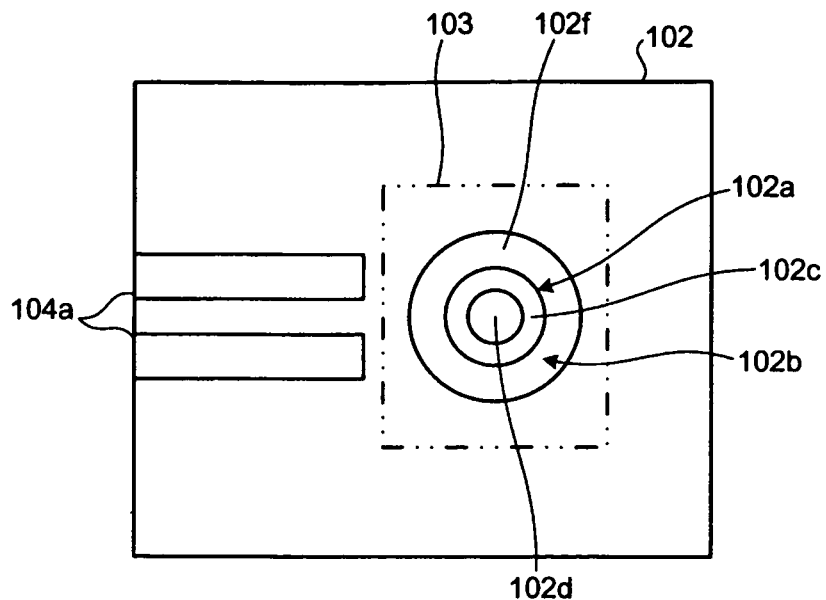
FIGS. 2A and 2B are a top view and a bottom view of a circuit board according to the first embodiment, respectively.

FIG. 2A is a top view of the circuit board according to the first embodiment. A circuit pattern is formed on the circuit board 102 of the light-receiving module 100 by providing linear signal electrodes 104a.

Two signal electrodes 104a connected to the light-receiving element 103 are arranged, one of which is an anode while the other is a cathode.

The truncated-conical transmissive portion 102a and the low refractive-index portion 102b surrounding the transmissive portion 102a are formed on the circuit board 102. The transmissive portion 102a has a circular top surface 102d. The bottom of the low refractive-index portion 102b is the supporting portion 102f. Thus, the transmissive portion 102a is fixed by the supporting portion 102f.

Figure 2B:
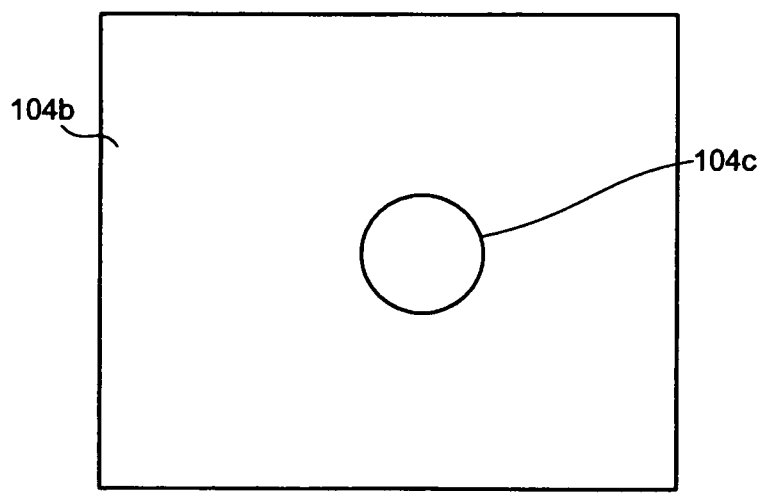

FIG. 2B is a bottom view of the circuit board according to the first embodiment. The ground electrode 104b is provided on the lower surface of the circuit board 102 of the light-receiving module 100, thereby forming a stripline structure along with the signal electrodes 104a. An opening 104c for transmitting the signal light is provided in the ground electrode 104b.

Figure 3A:
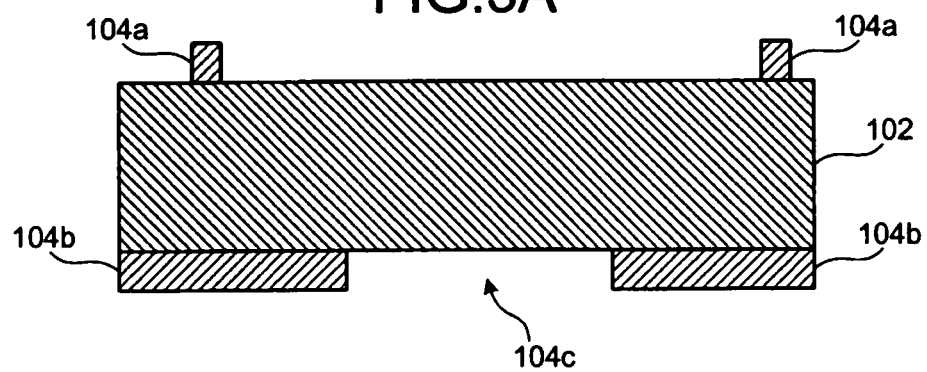
FIGS. 3A and 3B are diagrams of a first step and a second step of a fabrication process of the light-receiving module, respectively.
Figure 3B:
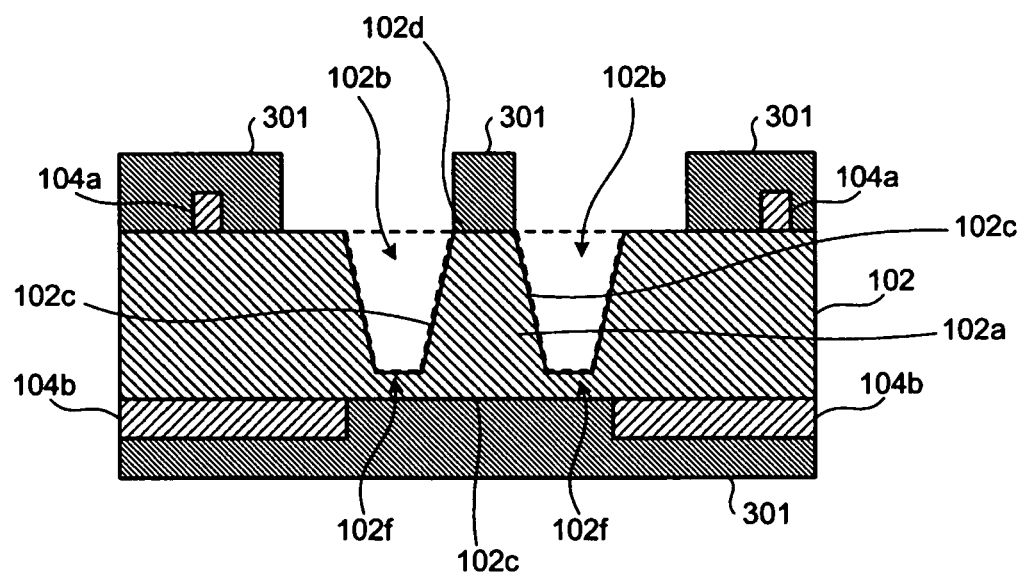

FIGS. 3A and 3B are diagrams of a first step and a second step of a fabrication process of the light-receiving module according to the first embodiment, respectively.

At the first step depicted in FIG. 3A, a circuit pattern is made on the circuit board 102 that includes a polyimide thin film. Specifically, the signal electrodes 104a and the ground electrode 104b are formed by arranging copper foil on the circuit board 102.

At the second step depicted in FIG. 3B, a resist pattern 301 is formed on the circuit board 102 and the low refractive-index portion 102b is formed by etching.

Specifically, the truncated-conical transmissive portion 102a with its top surface 102d having a smaller area than the bottom surface 102e is formed by etching using a doughnut-shaped resist pattern 301 on the circuit board 102, at a surface on the signal electrode 104a side of the circuit board 102. The time of the etching at the second step is controlled such that the circuit board 102 is not penetrated, thereby forming the supporting portion 102f that fixes and supports the transmissive portion 102a on the circuit board 102.

Both surfaces of the circuit board 102 may be etched at the second step using the resist pattern 301 that protects the surface on the signal electrode 104a side of the circuit board 102. Alternatively, the surface on the signal electrode 104a side alone may be etched. The etching may be wet etching using solution, or dry etching using gas. For example, alkali solution can be used as the solution.

After the second step, the light-receiving module 100 is completed by mounting the optical waveguide 101 and the light-receiving element 103 on the circuit board 102, with the light-receiving portion 103a facing the circuit board 102. The optical waveguide 101 is positioned such that the signal light is output to the transmissive portion 102a. The light-receiving element 103 is positioned such that the signal light that has transmitted through the transmissive portion 102a is received by the light-receiving portion 103a. The light-receiving element 103 is connected to the circuit pattern made at the first step.

Thus, the light-receiving module 100 can be made by a simple fabrication method in which the second step described above is added to the conventional fabrication method of the conventional light-receiving module in which the circuit pattern is made on the circuit board and the light-receiving element and the optical waveguide are provided on the circuit board. The second step can be performed without any special processing technology, thereby suppressing fabrication cost. That is, low-loss optical coupling can be achieved by the light-receiving module 100 that can be easily fabricated.

In the present embodiment, the second step of forming the transmissive portion 102a and the low refractive-index portion 102b by etching is performed after the first step of forming the circuit pattern on the circuit board 102. Alternatively, for example, a step of forming the circuit pattern on the circuit board 102 may be performed after forming the transmissive portion 102a and the low refractive-index portion 102b by etching.

As described above, the light-receiving module 100 can suppress the dispersion of the signal light without any fabrication process requiring high precision such as a technology with a microlens that is mounted on the circuit board and collects the signal light (see, for example, Japanese Laid-Open Patent Publication No. 2004-241630 described above).

Further, the light-receiving module 100 can be fabricated in fewer steps than a technology with a reflection mirror that is provided on a circuit board having an opening and collects the signal light (see, for example, Japanese Laid-Open Patent Publication No. 2009-16707 described above). Furthermore, the light-receiving module 100 can suppress the dispersion of the signal light without any special fabrication process such as a technology with an optical waveguide that has a special shape and collects the signal light (see, for example, Japanese Laid-Open Patent Publication No. 2006-47764 described above). Thus, the light-receiving module 100 can be easily fabricated.

Figure 4:
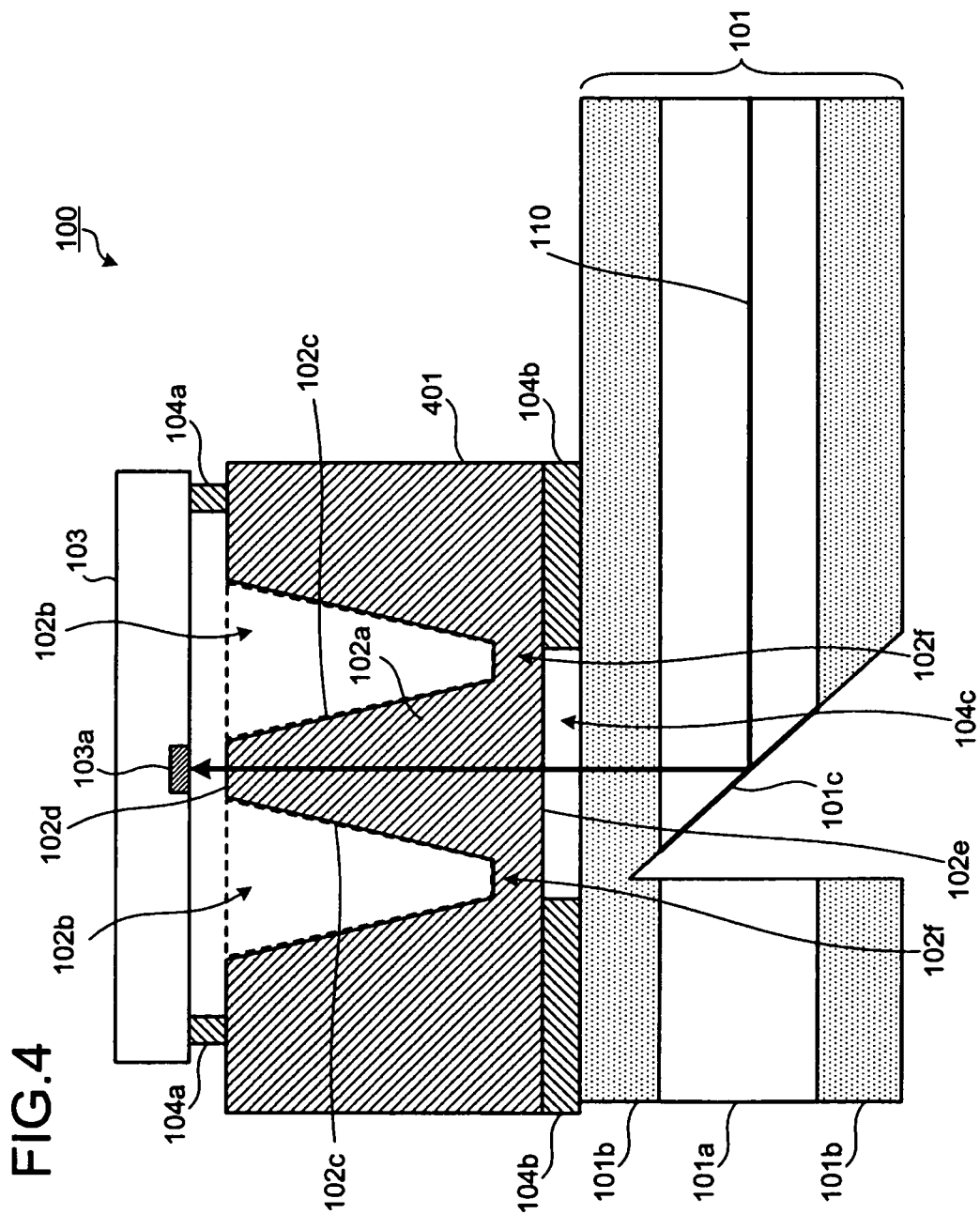
FIG. 4 is a cross-sectional view of a light-receiving module according to a first modification of the first embodiment.

FIG. 4 is a cross-sectional view of a light-receiving module according to a first modification of the first embodiment. Components similar to those of the light-receiving module 100 according to the first embodiment are assigned the signs used in the first embodiment and description thereof is omitted. In the light-receiving module 100 depicted in FIG. 4, the circuit board 102 described in FIG. 1A is implemented by a transparent glass substrate 401.

The low refractive-index portion 102b is formed in the light-receiving module 100 by removing the glass substrate 401 around the transmissive portion 102a. The glass substrate 401 has the thickness of several hundred μm, and is thicker than the circuit board 102 implemented by the FPC board. Thus, the transmissive portion 102a can be less inclined in the glass substrate 401 than the circuit board 102.

Thus, the signal light can be completely reflected by using the glass substrate 401 even when the spread angle of the signal light output from the optical waveguide 101 is large. Thus, low-loss optical coupling can be achieved by a simple fabrication process of providing the transmissive portion 102a and the low refractive-index portion 102b in the glass substrate 401. The transmissive portion 102a of the glass substrate 401 is fabricated by laser processing, for example.

Figure 5:
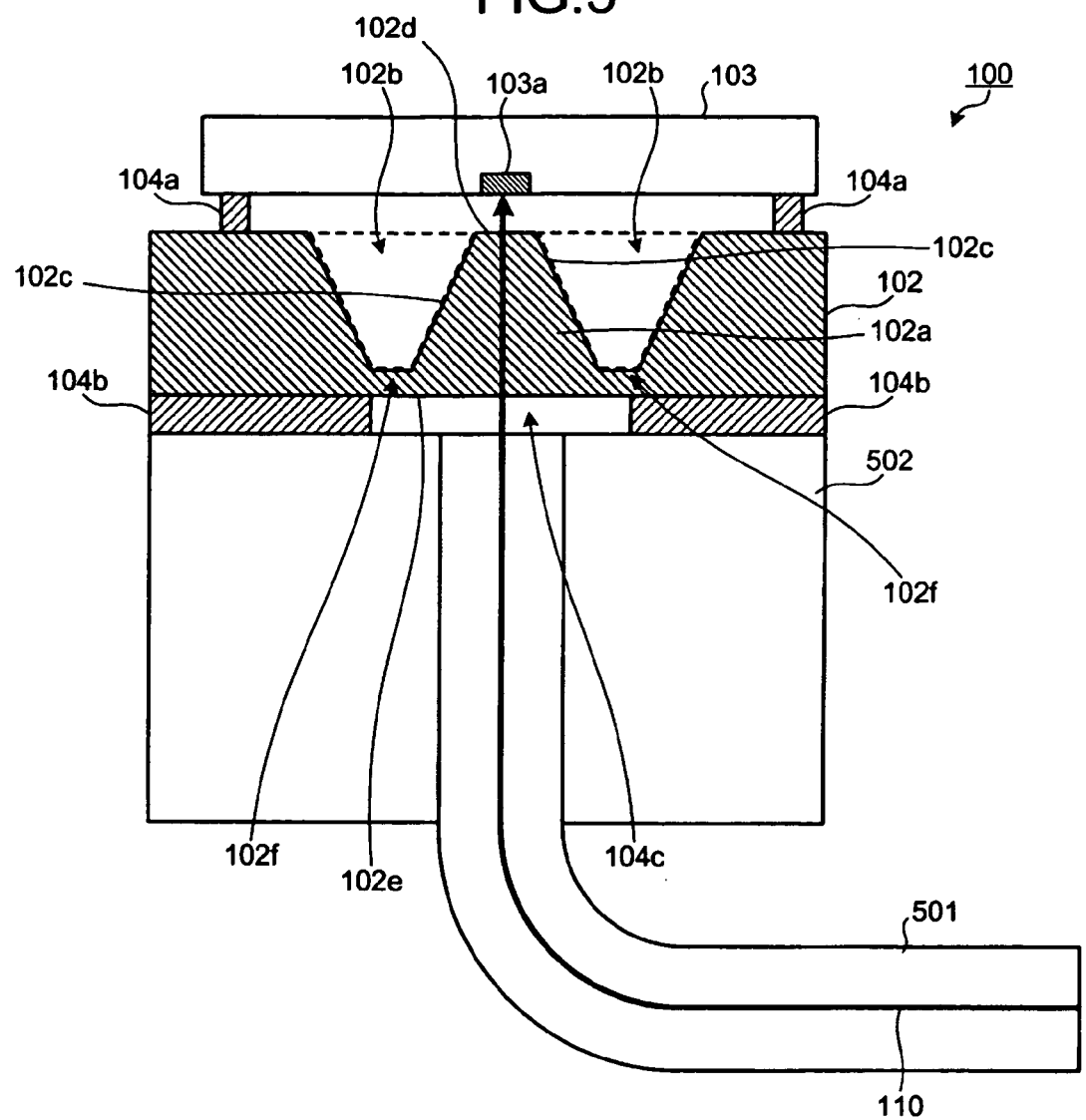
FIG. 5 is a cross-sectional view of a light-receiving module according to a second modification of the first embodiment.

FIG. 5 is a cross-sectional view of a light-receiving module according to a second modification of the first embodiment. Components similar to those of the light-receiving module 100 according to the first embodiment are assigned the same signs used in the first embodiment and description thereof is omitted.

In the light-receiving module 100 depicted in FIG. 5, the optical waveguide 101 described in FIG. 1A is replaced with an optical fiber 501 and an optical connector 502. The optical fiber 501 that outputs the signal light is connected to the circuit board 102 by the optical connector 502.

The optical fiber 501 is provided so as to transmit and output the signal light toward the transmissive portion 102a. Thus, the signal light output from the optical fiber 501 is input to the transmissive portion 102a, completely reflected at the boundary surface 102c between the transmissive portion 102a and the low refractive-index portion 102b, and output to the light-receiving element 103, thereby reducing the signal light leaking outside of the light-receiving portion 103a. Thus, any means that transmits and outputs the signal light can be used as the optical waveguide 101.

As described above, in the light-receiving module 100 according to the first embodiment, the signal light output from the optical waveguide 101 is completely reflected at the boundary surface 102c between the transmissive portion 102a and the low refractive-index portion 102b that is formed by removing the circuit board 102, and is output to the light-receiving element 103. Thus, the light-receiving module 100 fabricated by a simple fabrication process can suppress the dispersion of the signal light to the outside of the light-receiving portion 103a. In other words, the light-receiving module that can be easily fabricated can improve the transmission performance by reduction of coupling loss.

In the light-receiving module 100 according to the first embodiment, the transmissive portion 102a, being formed such that the area of the cross section perpendicular to the traveling direction becomes smaller toward the light-receiving element 103, can collect the signal light. Thus, coupling loss can be reduced even when the light-receiving portion 103a of the light-receiving element 103 is smaller than the area of the signal light output from the optical waveguide 101.

In the light-receiving module 100 according to the first embodiment, the light-receiving element 103 includes a circular light-receiving portion 103a and the transmissive portion 102a has a circular cross section perpendicular to the traveling direction of the signal light. Thus, the signal light can be collected into a circular shape corresponding to the shape of the light-receiving portion 103a, thereby achieving optical coupling with lower loss.

In the light-receiving module 100 according to the first embodiment, the low refractive-index portion 102b is formed by removing the circuit board 102 around the transmissive portion 102a so as not to penetrate the circuit board 102, thereby forming the supporting portion 102f. Thus, the light-receiving module 100 can be fabricated without adding a step of fixing the transmissive portion 102a.

The low refractive-index portion 102b is formed without penetrating the circuit board 102 at all in the first embodiment. Alternatively, for example, the low refractive-index portion 102b may be formed by penetrating a part of the circuit board 102 other than that around the transmissive portion 102a, as long as the supporting portion 102f that fixes the transmissive portion 102a can be formed.

The circuit board 102 of the light-receiving module 100 according to the first embodiment is an FPC board that includes a polyimide thin film. Thus, the transmissive portion 102a and the low refractive-index portion 102b can be formed inexpensively by etching. The FPC board, being thinner and more flexible than a glass substrate, can be installed anywhere and easily integrated.

The low refractive-index portion 102b can be easily fabricated since the low refractive-index portion 102b is a space from where the circuit board 102 is removed and thus, no filling of the space with material having a lower refractive index than the transmissive portion 102a is required. The light-receiving module 100 is also lightweight.

Figure 6:
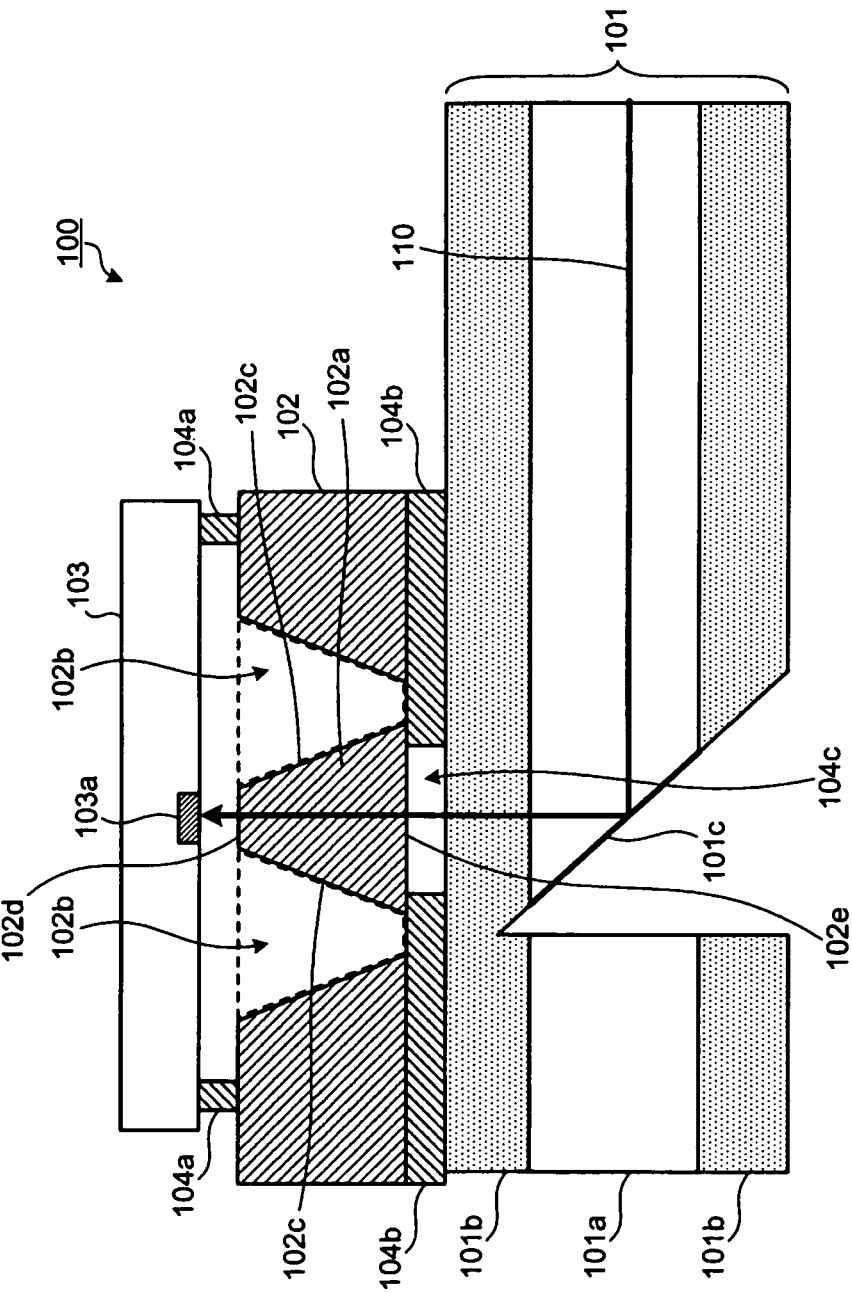
FIG. 6 is a cross-sectional view of a light-receiving module according to a second embodiment.

FIG. 6 is a cross-sectional view of a light-receiving module according to a second embodiment. Components similar to those of the light-receiving module 100 according to the first embodiment are assigned the signs used in the first embodiment and description thereof is omitted.

In the light-receiving module 100 depicted in FIG. 6, the transmissive portion 102a depicted in FIG. 1A is separated from the circuit board 102, and the opening 104c depicted in FIG. 1A is smaller than the bottom surface 102e of the transmissive portion 102a. Thus, the transmissive portion 102a separated from the circuit board 102 is fixed by the ground electrode 104b.

Figure 7A:
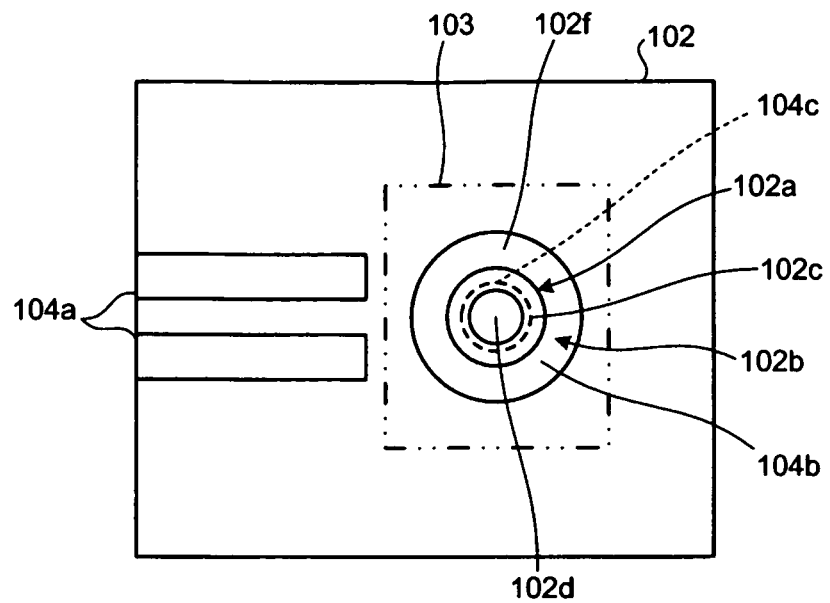
FIGS. 7A and 7B are a top view and a bottom view of a circuit board according to the second embodiment, respectively.

FIG. 7A is a top view of the circuit board according to the second embodiment. The truncated-conical transmissive portion 102a and the low refractive-index portion 102b surrounding the transmissive portion 102a are formed on the circuit board 102 of the light-receiving module 100. The ground electrode 104b is exposed to the bottom of the low refractive-index portion 102b since the transmissive portion 102a is separated from the circuit board 102. The opening 104c indicated by a dashed line is formed to have a smaller area than the bottom surface 102e. Thus, the transmissive portion 102a is fixed by the ground electrode 104b.

Figure 7B:
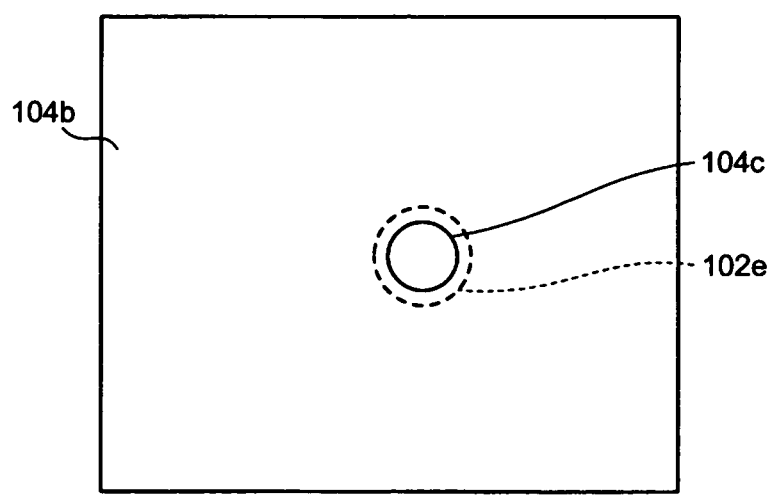

FIG. 7B is a bottom view of the circuit board according to the second embodiment. The lower surface of the circuit board 102 of the light-receiving module 100 has the opening 104c of the ground electrode 104b for transmitting the signal light. The opening 104c is formed to have a smaller area than the bottom surface 102e of the transmissive portion 102a and to fix the transmissive portion 102a.

Figure 8A:
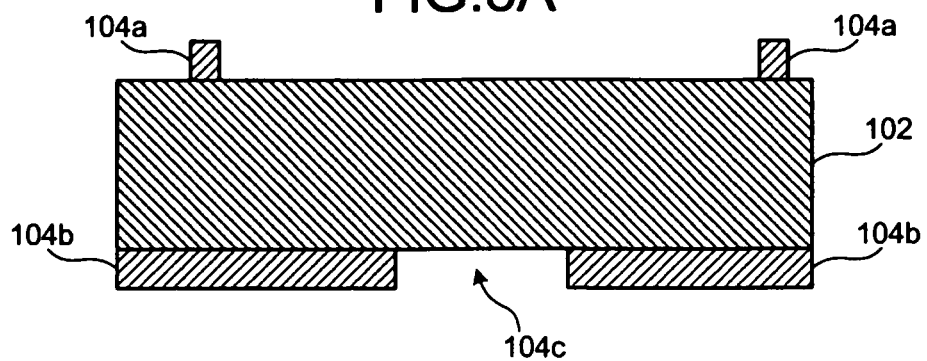
FIGS. 8A and 8B are diagrams of a first step and a second step of a fabrication process of the light-receiving module, respectively.
Figure 8B:
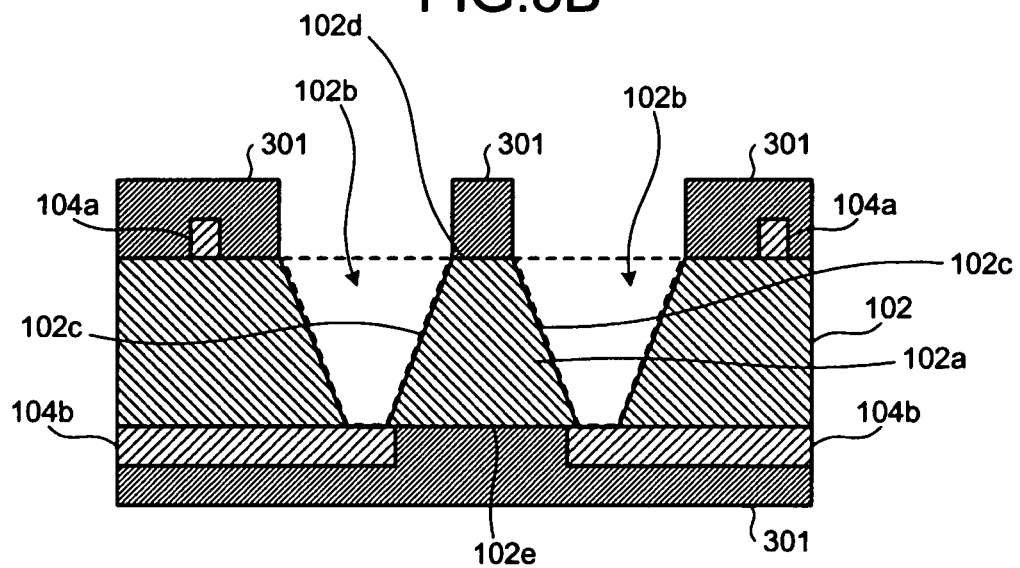

FIGS. 8A and 8B are diagrams of a first step and a second step of a fabrication process of the light-receiving module according to the second embodiment, respectively.

At the first step depicted in FIG. 8A, a circuit pattern is made on the circuit board 102 that includes a polyimide thin film. Specifically, the signal electrodes 104a and the ground electrode 104b are formed by arranging copper foil on the circuit board 102. The ground electrode 104b is formed to have the opening 104c that can fix the transmissive portion 102a.

At the second step depicted in FIG. 8B, the resist pattern 301 is formed on the circuit board 102, and etching is performed for a time sufficient to penetrate the circuit board 102, whereby the low refractive-index portion 102b reaches the bottom of the circuit board 102 and the transmissive portion 102a is separated from the circuit board 102.

After the second step, the light-receiving module 100 is completed by mounting the optical waveguide 101 and the light-receiving element 103 on the circuit board 102, with the light-receiving portion 103a facing the circuit board 102. Thus, the light-receiving module 100 according to the second embodiment can be easily fabricated without adding a step of forming a fixing member that fixes the transmissive portion 102a and without precise time control.

FIG. 9 is a cross-sectional view of a light-receiving module according to a modification of the second embodiment. Components similar to those of the light-receiving module 100 according to the first or the second embodiment are assigned the same signs used in the first and the second embodiments, and description thereof is omitted.

In the light-receiving module 100 depicted in FIG. 9, the transmissive portion 102a is fixed by a part of the ground electrode 104b. If the circuit board 102 is made of lightweight material such as an FPC board, the transmissive portion 102a can be fixed by at least a part of the ground electrode 104b contacting the transmissive portion 102a.

Figure 10A:
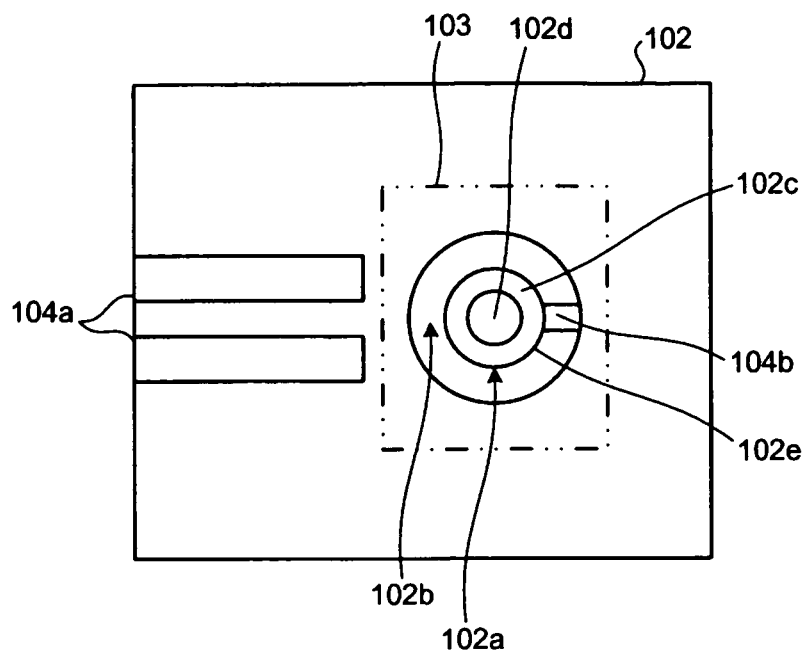
FIGS. 10A and 10B are a top view and a bottom view of a circuit board according to the modification of the second embodiment, respectively.

FIG. 10A is a top view of the circuit board according to the modification of the second embodiment. The truncated-conical transmissive portion 102a and the low refractive-index portion 102b surrounding the transmissive portion 102a are formed on the circuit board 102 of the light-receiving module 100. The protruding ground electrode 104b is exposed to the bottom of the low refractive-index portion 102b since the transmissive portion 102a is separated from the circuit board 102. Thus, the transmissive portion 102a is fixed by the ground electrode 104b protruding into the opening 104c.

Figure 10B:
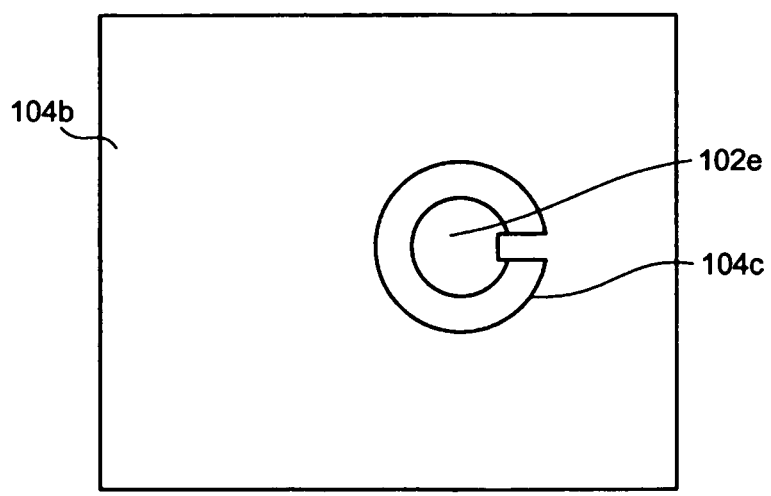

FIG. 10B is a bottom view of the circuit board according to the modification of the second embodiment. At the lower surface of the circuit board 102 of the light-receiving module 100, the transmissive portion 102a is fixed by the ground electrode 104b protruding into the opening 104c of the ground electrode 104b and contacting the bottom surface 102e of the transmissive portion 102a. Thus, the transmissive portion 102a can be fixed by the ground electrode 104b contacting at least a part of the bottom surface 102e of the transmissive portion 102a.

As described above, in the light-receiving module 100 according to the second embodiment, the low refractive-index portion 102b is formed by removing and penetrating a part of the circuit board 102 around the transmissive portion 102a and fixed onto the ground electrode 104b. Thus, fabrication of the light-receiving module 100 can be further facilitated since no time control is required in the etching.

The contact area of the transmissive portion 102a and the ground electrode 104b is small since the transmissive portion 102a is fixed by a part of the ground electrode 104b contacting the bottom surface 102e of the transmissive portion 102a, thereby reducing the blocking of the signal light by the ground electrode 104b.

FIG. 11 is a cross-sectional view of a light-receiving module according to the third embodiment. Components similar to those of the light-receiving module 100 according to the first or the second embodiment are assigned the same signs used in the first and the second embodiments, and description thereof is omitted.

The light-receiving module 100 depicted in FIG. 11 includes a transparent circuit board 1101 sandwiched between the circuit board 102 and the optical waveguide 101 of the light-receiving module 100 according to the first embodiment. The circuit board 1101 transmits the signal light output from the optical waveguide 101 and is implemented by, for example, an FPC board similar to the circuit board 102.

Such a multilayered light-receiving module with several circuit boards is intended for a highly-compacted integrated circuit. The ground electrode 1102 on the circuit board 1101 is positioned such that the signal light output from the optical waveguide 101 is transmitted to the transmissive portion 102a without being blocked. The ground electrode 1102 has an opening 1102 that has a size sufficient to transmit the signal light. Signal electrodes (not depicted) are also arranged on the circuit board 1101.

In such a multilayered light-receiving module, the distance from the optical waveguide 101 to the light-receiving element 103 is greater than that of the light-receiving module formed by a single circuit board. As a result, the signal light output from the optical waveguide 101 disperses more in the multilayered light-receiving module than the light-receiving module formed by a single circuit board, thereby increasing coupling loss.

Herein, the signal light dispersed in the circuit board 1101 can be collected by the transmissive portion 102a of the circuit board 102 and the low refractive-index portion 102b around the transmissive portion 102a, thereby reducing coupling loss with simple fabrication even in a multilayered light-receiving module.

As described above, the light-receiving module 100 according to the third embodiment is a multilayered light-receiving module that includes the circuit board 102 with the transmissive portion 102a and the low refractive-index portion 102b around the transmissive portion 102a, thereby achieving low-loss optical coupling with simple fabrication even in a multilayered light-receiving module.

Figure 12:
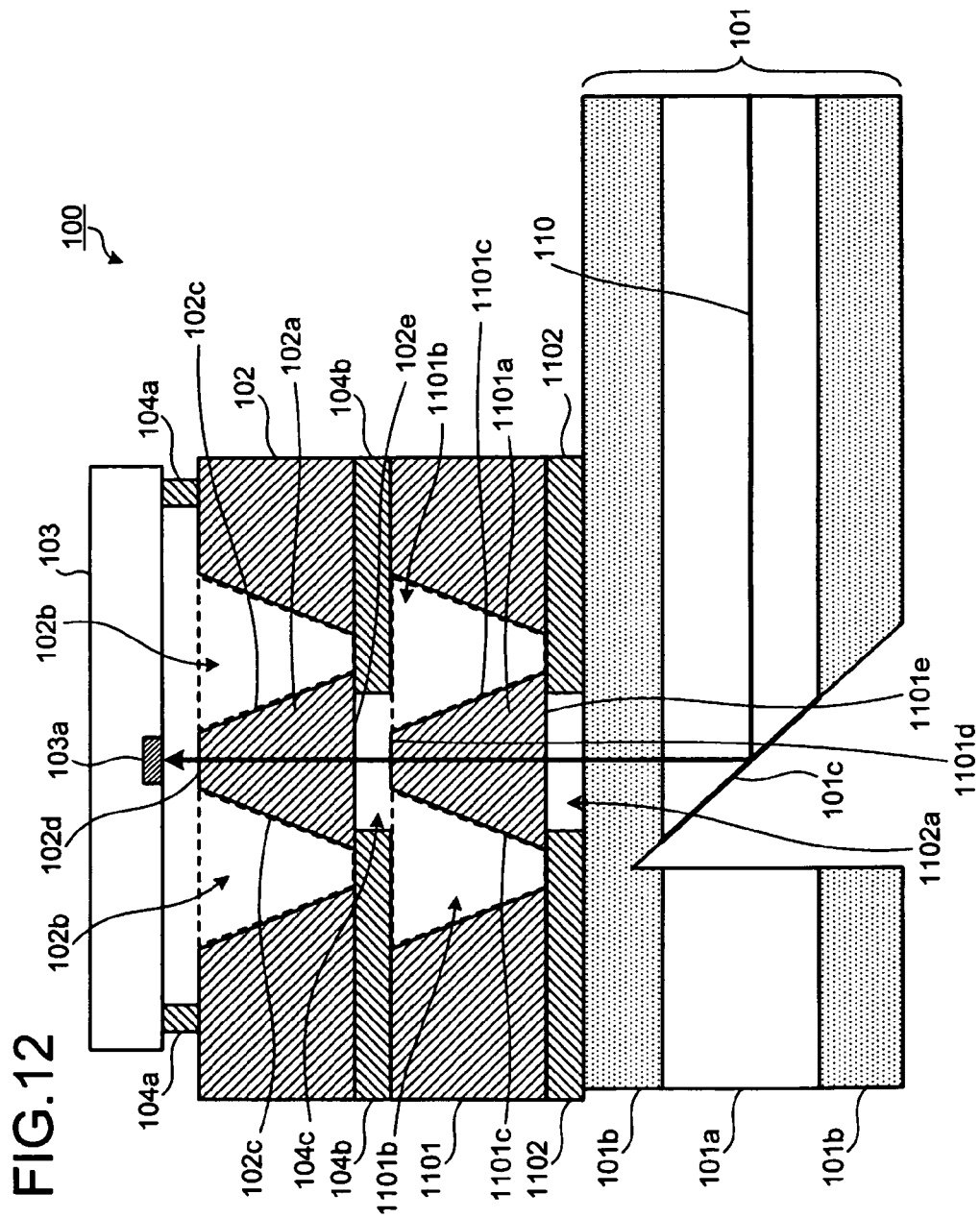
FIG. 12 is a cross-sectional view of a light-receiving module according a modification of the third embodiment.

FIG. 12 is a cross-sectional view of a light-receiving module according to a modification of the third embodiment. Components similar to those of the light-receiving module 100 according to the first to the third embodiments are assigned the same signs used in the first to the third embodiments, and description thereof is omitted. The light-receiving module 100 depicted in FIG. 12 is a multilayered light-receiving module in which the circuit board 1101 is layered on the circuit board 102, on the surface on the optical waveguide 101 side of the circuit board 102.

The circuit board 1101 includes a transmissive portion 1101a that transmits the signal light and a low refractive-index portion 1101b that surrounds the transmissive portion 1101a and has a lower refractive index than the transmissive portion 1101a. The low refractive-index portion 1101b is formed by removing the circuit board 1101 around the transmissive portion 1101a.

The transmissive portion 1101a and the low refractive-index portion 1101b are formed such that the complete reflection condition is satisfied and the signal light output from the optical waveguide 101 is completely reflected at a boundary surface 1101c. The transmissive portion 1101a is formed as a truncated cone with a top surface 1101d toward the light-receiving element 103 and a bottom surface 1101e toward the optical waveguide 101. The area of the top surface 1101d is smaller than that of the bottom surface 1101e.

Thus, the signal light output from the optical waveguide 101 is input to the transmissive portion 1101a from the bottom surface 1101e, completely reflected at the boundary surface 1101c, and output from the top surface 1101d. The signal light output from the top surface 1101d is input to the transmissive portion 102a from the bottom surface 102e, completely reflected at the boundary surface 102c, and output to the light-receiving portion 103a from the top surface 102d.

Thus, the dispersion of the signal light output from the optical waveguide 101 is suppressed by each circuit board 102, 1101. In other words, even in a multilayered light-receiving module 100, the dispersion can be suppressed more by providing the low refractive-index portion in each circuit board. Optical coupling with lower loss than the multilayered light-receiving module 100 described in FIG. 11 can be also achieved. The number of the circuit boards is not limited to two as in the multilayered light-receiving module 100 according to the third embodiment.

FIG. 13 is a cross-sectional view of a light-emitting module according to a fourth embodiment. Components similar to those of the light-receiving module 100 according to the first to the third embodiments are assigned the same signs used in the first to the third embodiments, and description thereof is omitted. A light-emitting module 1300 depicted in FIG. 13 is an optical module that includes a light-emitting element 1301, a transparent circuit board 1302, and an optical waveguide 101 that transmits the signal light.

The light-emitting element 1301 outputs a signal light converted from an electrical signal and includes, at a surface on the circuit board 1302 side of the light-emitting element 1301, a light-emitting portion 1301a that emits the signal light. For example, the light-emitting element 1301 is a semiconductor laser such as a vertical cavity surface emitting laser (VCSEL).

The circuit board 1302 is positioned so as to transmit the signal light output from the light-emitting element 1301. For example, the circuit board 1302 is an FPC board. On the circuit board 1302, at a surface on a surface on the light-emitting element 1301 side of the circuit board 1302, signal electrodes 104a connected to the light-emitting element 1301 are provided. At a circuit board 1302 surface on the side opposite of the light-emitting element 1301 side of the circuit board 1302, a ground electrode 104b is provided.

The circuit board 1302 includes a transmissive portion 1302a that transmits the signal light, and a low refractive-index portion 1302b having a lower refractive index than the transmissive portion 1302a. The low refractive-index portion 1302b is formed to neighbor and surround the transmissive portion 1302a. The transmissive portion 1302a and the low refractive-index portion 1302b are formed such that the complete reflection condition is satisfied and the signal light output from the light-emitting element 1301 is completely reflected at a boundary surface 1302c between the transmissive portion 1302a and the low refractive-index portion 1302b.

Thus, in the light-emitting module 1300, the signal light output from the light-emitting element 1301 is completely reflected at the boundary surface 1302c and output from the transmissive portion 1302a to the optical waveguide 101, as indicated by an optical path 1310 in the figure. Thus, the dispersion of the signal light output from the light-emitting element 1301 during transmission through the circuit board 1302 can be suppressed.

The low refractive-index portion 1302b is formed by removing the circuit board 1302 around the transmissive portion 1302a. Thus, low-loss optical coupling can be achieved by the light-emitting module 1300 that can be easily fabricated.

The transmissive portion 1302a is formed as a truncated cone with a top surface 1302d on the side of the light-emitting element 1301 and a bottom surface 1302e on the side of the optical waveguide 101. The area of the bottom surface 1302e is smaller than the top surface 1302d. Thus, the signal light input to the transmissive portion 1302a is collected and output from the bottom surface 1302e of the transmissive portion 1302a.

Thus, signal light leaking outside of the optical waveguide 101 can be reduced even when the incident area of the core 101a of the optical waveguide 101 is smaller than the area of the signal light output from the light-emitting element 1301, thereby reducing coupling loss.

The transmissive portion 1302a is not limited to the truncated cone as long as it is formed such that the complete reflection condition is satisfied and the area of the cross section perpendicular to the traveling direction of the signal light becomes smaller toward the optical waveguide 101. For example, the transmissive portion 1302a may be shaped such that the area of the cross section becomes smaller toward the bottom surface 1302e at a constant rate (e.g., N-sided pyramid) or an inconstant rate.

The low refractive-index portion 1302b is fixed by a supporting portion 1302f. Since the supporting portion 1302f is a part of the circuit board 1302, the dispersion of the signal light can be suppressed by the light-emitting module 1300 that is fabricated by a simple fabrication process requiring no step of providing a fixing member that fixes the transmissive portion 1302a.

As described in the third embodiment, the dispersion of the signal light in a multilayered optical module with several transparent circuit boards is larger than the light-emitting module with a single circuit board. Thus, the transmissive portion 1302a and the low refractive-index portion 1302b may be provided in the circuit board closest to the optical waveguide 101 in the multilayered light-emitting module. In this case, the signal light that has been dispersed during transmission through the circuit boards can be collected, thereby achieving low-loss optical coupling.

The transmissive portion 1302a and the low refractive-index portion 1302b may be provided in each circuit board of the multilayered light-emitting module. In this case, the dispersion of the signal light can be suppressed by each circuit board, thereby achieving optical coupling with lower loss.

Figure 14A:
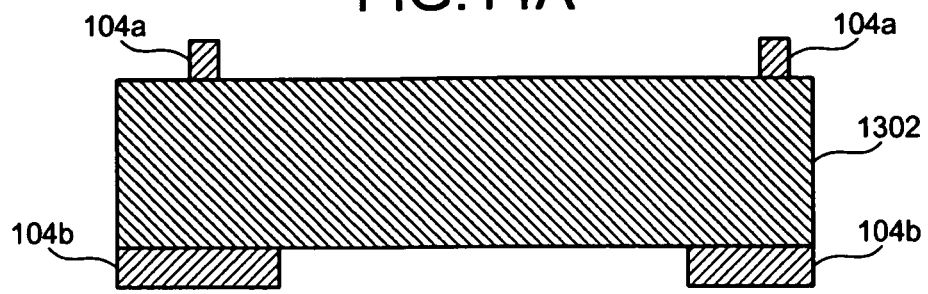
FIGS. 14A and 14B are diagrams of a first step and a second step of a fabrication process of the light-emitting module, respectively.
Figure 14B:
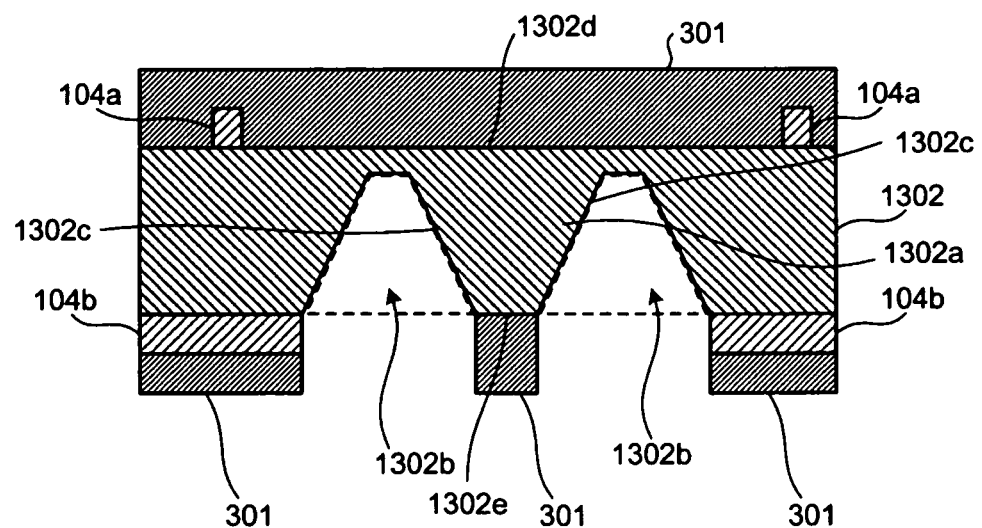

FIGS. 14A and 14B are diagrams of a first step and a second step of a fabrication process of the light-emitting module according to the fourth embodiment, respectively.

At the first step depicted in FIG. 14A, a circuit pattern is formed on the circuit board 1302 that includes a polyimide thin film. Specifically, the signal electrodes 104a and the ground electrode 104b are formed by arranging copper foil on the circuit board 1302.

At the second step depicted in FIG. 14B, the resist pattern 301 is formed on the circuit board 1302 and the low refractive-index portion 1302b is formed by etching.

The truncated-conical transmissive portion 1302a with its bottom surface 1302e having a smaller area than the top surface 1302d is formed by etching using a doughnut-shaped resist pattern 301 on the surface of the circuit board 1302 on the side of the ground electrode 104b.

At the second step, the time of the etching is controlled with sufficient precision not to penetrate the circuit board 1302, thereby forming the transmissive portion 1302a without being separated from the circuit board 1302.

After the second step, the light-emitting module 1300 is completed by mounting the optical waveguide 101 and the light-emitting element 1301 on the circuit board 1302, with the light-emitting portion 1301a facing the circuit board 1302. The light-emitting element 1301 is positioned such that the signal light is output to the transmissive portion 1302a. The optical waveguide 101 is positioned such that the signal light that has transmitted through the transmissive portion 1302a is input thereto.

Thus, the light-emitting module 1300 can be made by a simple fabrication method in which the second step described above is added to the conventional fabrication method of the conventional light-emitting module in which the circuit pattern is made on the circuit board and the light-emitting element and the optical waveguide are provided on the circuit board. The second step can be performed without any special processing technology, thereby suppressing fabrication cost. That is, low-loss optical coupling can be achieved by the light-emitting module 1300 that can be easily fabricated.

In the present embodiment, the second step of forming the transmissive portion 1302a and the low refractive-index portion 1302b by etching is performed after the first step of making the circuit pattern on the circuit board 1302. Alternatively, for example, a step of making the circuit pattern on the circuit board 1302 may be performed after forming the transmissive portion 1302a and the low refractive-index portion 1302b by etching.

Similar to the first embodiment, a glass substrate may be used as the circuit board 1302 in the fourth embodiment. An optical fiber can be used instead of the optical waveguide 101.

An example of an optical transmission device on which the light-receiving module 100 and the light-emitting module 1300 according to any one of the embodiments described above are mounted will be described.

FIG. 15A is a top view of an optical transmission device on which the light-receiving module 100 depicted in FIG. 1A and the light-emitting module 1300 depicted in FIG. 13 are mounted. FIGS. 15B and 15C are partial cross-sectional views of the optical transmission device including the light-receiving module and the light-emitting module, respectively.

In an optical transmission device 1500 depicted in FIGS. 15A to 15C, the circuit board 102 is connected, via an electrical connector 1502, to a printed board 1501 that transmits the electrical signal. The optical waveguide 101 that transmits the signal light is connected to the rear surface of the circuit board 102.

The light-receiving element 103 is provided on the circuit board 102. Thus, the light-receiving module 100 is mounted on the optical transmission device 1500. A transimpedance amplifier (TIA) 1503 for converting current from the light-receiving element 103 to a voltage is connected to the circuit board 102.

Thus, the optical transmission device 1500 converts the signal light received by the light-receiving module 100 to an electrical signal, and transmits the electrical signal by the printed board. The transmissive portion 102a and the low refractive-index portion 102b depicted in FIG. 1A enable low-loss optical coupling, and a fast optical transmission device 1500 with simple fabrication.

The light-emitting element 1301 is provided on the circuit board 102. Thus, the light-emitting module 1300 is mounted on the optical transmission device 1500. An IC 1504 that drives the light-emitting element 1301 is connected to the circuit board 102.

Thus, the optical transmission device 1500 converts an electrical signal to the signal light by the light-emitting module 1300, and emits the signal light. The transmissive portion 1302a and the low refractive-index portion 1302b depicted in FIG. 13 enable low-loss optical coupling, and a fast optical transmission device 1500 that can be easily fabricated.

Although not depicted, the core 101a of the optical waveguide 101 includes separate cores, one of which is for transmitting the signal light output from the light-emitting element 1301 and another of which is for transmitting the signal light output to the light-receiving element 103. The optical transmission device 1500 depicted in FIGS. 15A and 15B uses the light-receiving module 100 depicted in FIG. 1A as an example, and may use any light-receiving module according to the first to the third embodiments described above.

As long as at least the transmissive portions 102a, 1101a, and 1302a can transmit the signal light, the circuit boards 102, 1101, 1302 and the glass substrate 401 need not be transparent as described above. For example, circuit boards 102, 1101, 1302 and a glass substrate 401 in which only transmissive portions 102a, 1101a, and 1302a are transparent may be used.

As described above, the optical module and the fabrication method can improve the coupling efficiency and the transmission performance with simple fabrication.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical module comprising:
   an optical waveguide that transmits and outputs signal light;
   a circuit board that transmits the signal light output from the optical waveguide, and includes a low refractive-index portion that neighbors and surrounds a transmissive portion and has a lower refractive index than the transmissive portion, which transmits the signal light; and
   a light-receiving element that includes, on a side toward the circuit board, a light-receiving portion that receives the signal light that has transmitted through the circuit board, wherein
   the signal light is reflected toward the light-receiving element at a boundary surface between the transmissive portion and the low refractive-index portion,
   the circuit board includes a ground electrode at a surface on a side opposite of a circuit board surface toward the light-receiving element,
   the low refractive-index portion is provided up to a bottom of the circuit board, and
   the transmissive portion is fixed by the ground electrode provided on the circuit board.

2. The optical module according to claim 1, wherein
   a circuit pattern is formed on the circuit board, and
   the light-receiving element is connected to the circuit pattern formed on the circuit board.

3. The optical module according to claim 1, wherein a cross section of the transmissive portion perpendicular to a traveling direction of the signal light becomes smaller toward the light-receiving element.

4. The optical module according to claim 1, wherein
   the light-receiving portion has a circular light-receiving surface, and
   the transmissive portion has a circular cross section perpendicular to the traveling direction of the signal light.

5. The optical module according to claim 1, further comprising another circuit board that is layered on the circuit board, on a side toward the optical waveguide and transmits the signal light output from the optical waveguide to the light-receiving portion.

6. The optical module according to claim 1, wherein
the circuit board is provided in plurality and layered one on another, and
the light-receiving element receives the signal light that has been transmitted through a plurality of transmissive portions.

7. The optical module according to claim 1, wherein the circuit board is a flexible printed circuit board that includes a polyimide thin film.

8. The optical module according to claim 1, wherein the low refractive-index portion is an air layer formed by removing a part of the circuit board.

9. A fabrication method of an optical module that includes an optical waveguide that transmits and outputs signal light, a circuit board that transmits the signal light output from the optical waveguide, and a light-receiving element that includes, on a side toward the circuit board, a light-receiving portion that receives the signal light that has been transmitted through the circuit board, the fabrication method comprising:

making a circuit pattern on the circuit board;

forming, on the circuit board, a low refractive-index portion that neighbors and surrounds a transmissive portion and has a lower refractive index than the transmissive portion, which transmits the signal light; and mounting the optical waveguide and the light-receiving element on the circuit board after the making and the forming, wherein the circuit board includes a ground electrode at a surface on a side opposite of a circuit board surface toward the light-receiving element, and the low refractive-index portion is formed at the forming by removing the circuit board around the transmissive portion such that the circuit board is penetrated and the transmissive portion is fixed onto the ground electrode.

10. The fabrication method according to claim 9, wherein at the mounting, the light-receiving element is connected to the circuit pattern made on the circuit board at the making.

11. The fabrication method according to claim 9, wherein the low refractive-index portion is formed at the forming by removing the circuit board around the transmissive portion.

* * * * *